(12) United States Patent
Wu et al.

(10) Patent No.: US 10,447,219 B2
(45) Date of Patent: Oct. 15, 2019

(54) CALIBRATION SYSTEM AND METHOD FOR OPTIMIZING LEAKAGE PERFORMANCE OF A MULTI-PORT AMPLIFIER

(71) Applicant: MacDonald, Dettwiler and Associates Corporation, Ste-Anne-de-Bellevue (CA)

(72) Inventors: Haiqing Wu, Dollard-des-Ormeaux (CA); Steve Hatzigeorgiou, Kirkland (CA); Michel Tremblay, St-Eustache (CA); Brent Stoute, Senneville (CA)

(73) Assignee: MACDONALD, DETTWILER AND ASSOCIATES CORPORATION, Ste-Anne-de-Bellevue, QC (CA)

( * ) Notice: Subject to any disclaimer, the term of this patent is extended or adjusted under 35 U.S.C. 154(b) by 0 days.

(21) Appl. No.: 15/853,588

(22) Filed: Dec. 22, 2017

(65) Prior Publication Data

US 2018/0183397 A1    Jun. 28, 2018

Related U.S. Application Data

(60) Provisional application No. 62/438,919, filed on Dec. 23, 2016.

(51) Int. Cl.
*H03F 3/68* (2006.01)
*H03F 3/193* (2006.01)
(Continued)

(52) U.S. Cl.
CPC ............... *H03F 3/68* (2013.01); *H03F 1/02* (2013.01); *H03F 1/0205* (2013.01); (Continued)

(58) Field of Classification Search
CPC ... H03F 3/68; H03F 1/02; H03F 3/189; H03F 1/3282; H03F 1/0205; H03F 3/211;
(Continued)

(56) References Cited

U.S. PATENT DOCUMENTS 7,088,173 B1    8/2006    Rozario et al.
7,558,541 B2    7/2009    Rosen et al.
(Continued)

OTHER PUBLICATIONS

Ian Morris, et al, "Airbus Defence and Space: Ku Band Multiport Amplifier powers HTS Payloads into the future", 33rd AIAA International Communications Satellite Systems Conference, Australia, 2015-4340.

*Primary Examiner* — Eugene Yun
(74) *Attorney, Agent, or Firm* — Praxis

(57) ABSTRACT

A calibration system of architecture, apparatus, algorithms and method for optimizing leakage performance of a multi-port amplifier (MPA) for satellite communications. The calibration system comprises simple onboard apparatus and generally on-ground algorithms implementation connected via telecommand and telemetry links. The isolation performance of the MPA is monitored by using a commandable frequency generator and a flexible narrowband receiver. The high performance is achieved by direct and efficient optimization of the aggregate leakage of the MPA. The calibration system may be applied but not limited to Ku and Ka-band high throughput satellite systems.

16 Claims, 10 Drawing Sheets

(51) Int. Cl.
*H03F 3/21* (2006.01)
*H03F 1/02* (2006.01)
*H03F 1/32* (2006.01)
*H04B 7/185* (2006.01)
*H03F 3/189* (2006.01)

(52) U.S. Cl.
CPC ........... *H03F 1/3282* (2013.01); *H03F 3/189* (2013.01); *H03F 3/193* (2013.01); *H03F 3/211* (2013.01); *H04B 7/18515* (2013.01); *H03F 2200/451* (2013.01); *H03F 2203/30003* (2013.01)

(58) Field of Classification Search
CPC ............... H03F 3/193; H03F 2200/451; H03F 2203/30003; H04B 7/18515
USPC ......................................................... 455/92
See application file for complete search history.

(56) References Cited

U.S. PATENT DOCUMENTS

| | | |
|---|---|---|
| 7,822,147 B2 | 10/2010 | Huang et al. |
| 7,965,136 B2 | 6/2011 | Rhodes et al. |
| 8,103,225 B2 | 1/2012 | Couchman et al. |
| 8,463,204 B2 | 6/2013 | Jones et al. |
| 8,581,663 B2 | 11/2013 | Tronche et al. |
| 9,319,000 B2 | 4/2016 | Whelan |
| 9,413,306 B2 | 8/2016 | Moreau |
| 2017/0026006 A1* | 1/2017 | Roukos .................... H03F 1/42 |

* cited by examiner

Objective function of MPA aggregate leakage: $F = \sum_i \sum_{j \neq i} P_{ji}/P_{ii}$ Complex gain errors: $E = (g_{e1}e^{j\phi_{e1}}, g_{e2}e^{j\phi_{e2}}, \ldots, g_{eN}e^{j\phi_{eN}})$ Defined necessary variables: $X = f_x(E)$ Error correction parameters: $C = (g_{c1}e^{j\phi_{c1}}, g_{c2}e^{j\phi_{c2}}, \ldots, g_{cN}e^{j\phi_{cN}}) = f_c(X)$

Fig.6

| Calibration Mode | Mode 1 | Mode 2 | Mode 3 |
|---|---|---|---|
| Necessary variables to be solved | Gain/phase tracking errors | Gain/phase tracking errors | Differences between gain/phase errors and the average error |
| Error correction pattern | Errors compensated to the reference path gain/phase error | Errors compensated to the average gain/phase error | Errors compensated to the average gain/phase error |
| Necessary variable range | 2 x error range | 2 x error range | $(1 + \frac{1}{\sqrt{N}})$ x error range |
| Error compensation bias | Biased by the reference path | Unbiased (average gain/phase adjustment is 0) | Unbiased (average gain/phase adjustment is 0) |
| Necessary gain/phase adjustment range | 2 x error range | $(1 + \frac{1}{\sqrt{N}})$ x error range | $(1 + \frac{1}{\sqrt{N}})$ x error range |

Fig.7

CALIBRATION SYSTEM AND METHOD FOR OPTIMIZING LEAKAGE PERFORMANCE OF A MULTI-PORT AMPLIFIER

CROSS REFERENCE TO RELATED APPLICATIONS

This application claims priority of U.S. Provisional Application for Patent No. 62/438,919 filed Dec. 23, 2016, the content of which is incorporated herein by reference in its entirety

FIELD OF THE INVENTION

This invention generally relates to satellite communication systems, and particularly to the in-orbit calibration of multi-port amplifiers (MPA) used for satellite/spacecraft transmissions.

BACKGROUND OF THE INVENTION

The evolution to more advanced satellite systems, in particular the high throughput satellite (HTS) type of broadband systems with increasingly smaller spot beams, results in a high probability of mismatch between the satellite bandwidth and power and the actual traffic distribution over the beams in the service area. The multi-port amplifier (MPA) is an integral part of the satellite communication payload that will be fundamental in providing the flexible power allocation capability to satisfy the need to flexibly allocate power across beams, primarily to compensate for weather conditions and variations in traffic loading for each beam.

An MPA generally comprises an input hybrid matrix (IHM) which divides signals, an output hybrid matrix (OHM) which combines signals, and a plurality of high power amplifiers (HPAs)—either Solid State Power Amplifiers (SSPAs) or more traditional Travelling Wave Tube Amplifiers (TWTAs). The MPA components are arranged and aligned such that a signal input to an arbitrary port is divided by the IHM, then amplified by the HPAs, and finally recombined coherently by the OHM at a specific output port. The MPA provides access for each input port equally to each amplifier, and equal gain for all input signals. The MPA output power of each signal is proportional to its input power, providing output power flexibility by controlling the input power.

Such technology has been essential for narrowband mobile-satellite service (MSS) satellite systems at the lower L and S frequency bands, but its application at the higher Ku and Ka frequency bands is much more difficult due to the increasing difficulty of coherent power combining at the shorter wavelengths and larger bandwidths. The challenges of phase and amplitude misalignment of individual amplifiers of an MPA at the Ku/Ka-bands, and hence that of isolation and signal combining performance, become considerably greater and introduce complications regarding the feasibility of operating MPAs at these frequencies onboard a satellite and over the required service life. To achieve coherent power combining and minimize the port-to-port leakages, an in-orbit calibration system is critical for a high performance MPA. In general, the MPA calibration system will comprise a subsystem to detect/measure and compensate for the phase and amplitude errors introduced between the input and output of the MPA.

A few calibration methods for maintaining MPA isolation performance have been invented recently. One type of the calibration methods is to measure the gain/phase of the individual amplifiers and maintain the gain/phase tracking [U.S. Pat. Nos. 7,558,541, 7,965,136]. A specific form of frequency/phase modulated calibration signals are injected to the inputs of the individual amplifiers and the gain and phase errors of individual amplifiers are detected in baseband. However, the calibration accuracy is limited by the tolerance of the gain and phase detection and the imperfection of passive components which are not within the calibration loop.

Another type of calibration method is the phase and/or gain matching of individual amplifier pairs by detecting and minimizing the null level [U.S. Pat. Nos. 7,088,173, 8,103,225]. The test signals are injected using couplers within the IHM, or detected using couplers within the OHM, affecting the IHM/OHM performance. The calibration signals are in simple form, however, the calibration accuracy is limited by the hybrid imperfection and multi-loop calibration.

A third type of calibration method relies on detection at the MPA outputs, and estimate/adjust the composite signals at the individual amplifier outputs or the complex gains of the individual amplifiers with matrix manipulations [U.S. Pat. Nos. 8,581,663, 9,319,000]. A priori knowledge of unit transfer matrices is needed, and the calibration accuracy is limited by the measurement tolerances and passive component imperfections.

A fourth type of calibration method involves estimation of the special characteristics of the MPA output signals such as probability density function [U.S. Pat. No. 7,822,147], power spectrum [U.S. Pat. No. 8,463,204], or normalized mean cross-correlation [U.S. Pat. No. 9,413,306]. There are possibilities to use the traffic signals in lieu of test signals; however, there are certain constraints on input signal statistics and/or frequency plan. The calibration accuracy is limited by estimating the delta statistics of the output signals in the presence of intermodulation noise.

A fifth type of calibration method involves calibration signal detection on the ground [U.S. Pat. No. 7,965,136; Ian Morris, et al, "Airbus Defence and Space: Ku Band Multi-port Amplifier powers HTS Payloads into the future", AIAA 2015-4340]. However, such methods are constrained by the location of ground receivers and signal fading issues in propagation.

All above inventions do not provide direct onboard monitoring of MPA port-to-port leakages, and the calibration accuracy is limited by the measurement tolerances, passive component imperfection and/or intermodulation noises. Therefore, it would be desirable to have a calibration system that monitors the MPA leakages onboard the satellite, and directly minimize the MPA leakages. It could also be desirable to compromise between onboard and on-ground hardware/software requirements.

Accordingly, there is a need for an improved calibration system and method for optimizing leakage performance of a multi-port amplifier.

SUMMARY OF THE INVENTION

It is therefore a general object of the present invention to provide calibration system and method for optimizing leakage performance of a multi-port amplifier that could obviate the above-mentioned problems.

The present invention is to provide a calibration system for a multi-port amplifier onboard a satellite for operating at Ku/Ka bands and maintaining the leakage performance over the required service life. More specifically, the present invention is to provide a multi-port amplifier wherein the leakage performance may be monitored onboard the satellite and adjusted as often as necessary, to optimize the leakage performance of the multi-port amplifier.

A multi-port amplifier is defined as comprising an input hybrid matrix which divides signals, an output hybrid matrix which combines signals, and a plurality of high power amplifiers, and a calibration system which maintains the leakage performance of the multi-port amplifier. The multi-port amplifier components are arranged and aligned such that a signal input to an arbitrary port is divided by the input hybrid matrix, then amplified by the high power amplifiers, and finally recombined coherently by the output hybrid matrix at a specific output port.

The present invention provides a system of calibrating a multi-port amplifier for a communications satellite, the system comprising: providing a means to monitor the leakage performance of said multi-port amplifier onboard the satellite using a calibration signal; typically downlinking the onboard monitoring data via a conventional or payload-specific telemetry (TM) link, whichever is available; providing a means to optimize the leakage performance of the multi-port amplifier using a ground computer or optionally onboard processor; compensating the complex gain errors of said multi-port amplifier via a conventional or payload-specific telecommand (TC) link, whichever is available.

The present invention proposes, in a preferred embodiment, a set of apparatus of calibrating the multi-port amplifier, located onboard the satellite. The apparatus comprises a calibration signal generator that generates a sinusoidal signal, modulated signal or a spread spectrum signal with flexible center frequency, a calibration signal output distribution network that provides the calibration signal to any of the input ports of the multi-port amplifier; a calibration signal receive distribution network that receives the calibration signal coupled from any of the output ports of the multi-port amplifier, and a calibration signal detector to detect the amplified/leaked calibration signals coupled from the MPA output ports while traffic signals are present.

The present invention proposes, in a preferred embodiment, a method of complex gain error estimation, implemented in a ground computer or optionally onboard processor, for calibrating a multi-port amplifier. The method comprises an objective function defined for estimating the complex gain errors and error correction parameters, a calibration mode defined to ensure a unique solution, avoid runaway adjustment, reduce error correction range, and improve convergence, and a commonly-used search approach, such as pattern search or line search, used to achieve iteratively the optimization goal.

Using the calibration system embodiment provided in the present invention, the leakage performance of the multi-port amplifier may be monitored onboard the satellite and calibrated as often as necessary, thus making the multi-port amplifier suitable for operation at the high frequency bands such as Ku and Ka bands. The calibration approach may provide a compromise between onboard and on-ground hardware/software requirements.

Typically, the calibration signal of the present invention is centered at a calibration frequency at a time. The calibration frequency points are flexible such as a single point or a plurality of points according to the traffic bandwidth and the leakage performance requirement. Also, the calibration frequency is flexible, commandable and adaptable to the changes of the traffic frequency plan so that the calibration signal and traffic signals are compatible, and the calibration frequency may be selectively located at any band edge, guard band, sub-channel free of traffic signals, or any out-of-band frequency with adequate rejection after the multi-port amplifier.

The calibration signal may be detected with a narrowband filter so that the level of said calibration signal may be set low (typically with an amplitude level at least 20 dB lower than the amplitude level of the traffic signals) and the calibration frequency may be located at any point within the traffic band or out of the traffic band. Furthermore, the calibration signal may be spread spectrally and detected with a spread spectrum demodulator so that the calibration frequency may be located at any point within the traffic band or out of the traffic band.

Generally, the way of the calibration signal injection and output measurement is flexible, for example, single-input and multiple-output measurement, multiple-input and single-output measurement, or multiple-input and multiple-output measurement, so as to permit optional statistical averaging.

According to an aspect of the present invention there is provided a system for calibrating a multi-port amplifier transmitting traffic signals using a plurality of high power amplifiers connecting to an input hybrid matrix and an output hybrid matrix, all located onboard a spacecraft, the system comprising a plurality of input couplers connecting upstream to the input hybrid matrix, a plurality of complex gain adjusters connecting between the input hybrid matrix and the plurality of high power amplifiers, a plurality of output couplers connecting downstream of the output hybrid matrix, and a calibration apparatus including a calibration unit connecting to the plurality of input and output couplers, and a processing unit connecting to the calibration unit for implementing and running calibration algorithms.

In one embodiment, the calibration unit includes:
  a calibration signal generator generating a calibration signal being one of a sinusoidal signal, modulated signal and a spread spectrum signal with flexible calibration center frequency;
  a calibration signal output distribution network providing said calibration signal to at least one of the plurality of input couplers;
  a calibration signal receive distribution network receiving said calibration signal amplified and leaked by the multi-port amplifier and coupled to the traffic signals from at least one of the plurality of output couplers;
  a calibration signal detector detecting the amplified/leaked calibration signal from the calibration signal receive distribution network while the traffic signals are present, and determining a leakage level of the calibration signal.

In one embodiment, the calibration signal generator comprises a phase-locked voltage-controlled oscillator, and said calibration signal detector comprises a fixed-IF image-reject receiver, a narrowband IF filter and an RMS detector.

In one embodiment, the calibration signal generator comprises a phase-locked voltage-controlled oscillator, and said calibration signal detector comprises a dual-conversion receiver, a narrowband IF filter and an RMS detector.

In one embodiment, the calibration signal generator comprises a phase-locked voltage-controlled oscillator, and said calibration signal detector comprises a zero-IF receiver, narrowband low-pass filters and logarithmic amplifiers.

In one embodiment, the system further includes a telemetry downlink and a telecommand uplink to connect the calibration unit with the processing unit located on a ground station.

According to another aspect of the present invention there is provided a method for calibrating a multi-port amplifier of the above-mentioned system, the method comprising:

monitoring a leakage performance of said multi-port amplifier using a calibration signal;

optimizing the leakage performance of said multi-port amplifier using an iterative optimization process with an objective function for compensating complex gain errors of said multi-port amplifier.

In one embodiment, the step of monitoring includes the steps of:

generating the calibration signal being one of a sinusoidal signal, modulated signal and a spread spectrum signal, centered at a calibration frequency at a time;

providing said calibration signal to at least one of a plurality of input ports of said multi-port amplifier;

receiving said calibration signal amplified/leaked by the multi-port amplifier and coupled with the traffic signals from at least one of a plurality of output ports of said multi-port amplifier; and detecting the amplified/leaked calibration signal to determine a leakage level of the calibration signal.

In one embodiment, the step of generating includes determining said calibration frequency to be located at at least one single point depending on a frequency bandwidth of the traffic signals and a leakage performance requirement of the multi-port amplifier.

In one embodiment, the step of generating includes determining said calibration frequency to be flexible, commandable and adaptable to changes of a traffic frequency plan of the traffic signals so as to ensure that the calibration signal and the traffic signals are compatible.

In one embodiment, the traffic signals have a traffic frequency band thereof, and the step of generating includes determining said calibration frequency to be selectively located at one of a band edge of the traffic frequency band, a guard band of the traffic frequency band, a sub-channel free of the traffic signals, and an out-of-traffic signal band.

In one embodiment, the calibration signal has a calibration signal amplitude level being lower by at least 20 dB than a traffic amplitude level of the traffic signals and the step of detecting includes detecting said calibration signal using a narrowband filter so as to allow the calibration frequency to be located within a traffic frequency band of the traffic signals.

In one embodiment, the calibration signal is spread spectrally as a pseudo random noise spectrum and the step of detecting includes detecting said calibration signal using a spread spectrum demodulator so as to allow the calibration frequency to be located within a traffic frequency band of the traffic signals.

In one embodiment, the calibration signal and the coupled and amplified/leaked calibration signal are one of a single-input and multiple-output measurement, a multiple-input and single-output measurement, and a multiple-input and multiple-output measurement, so as to permit statistical averaging.

In one embodiment, the step of optimizing includes the steps of:

selecting a calibration mode to minimize the leakage performance of said multi-port amplifier with the objective function;

obtaining error correction parameters for the multi-port amplifier via calibration algorithms estimating the complex gain errors thereof from the leakage level of the calibration signal;

generating a command signal for the multi-port amplifier based on the error correction parameters; and transmitting the command signal to the multi-port amplifier.

In one embodiment, the step of detecting includes transmitting the leakage level of the calibration signal from the calibration unit to a ground station via a telemetry downlink.

In one embodiment, the steps of selecting, obtaining and generating are implemented in a ground computer of the processing unit located on the ground station so as to avoid complicated onboard apparatus.

In one embodiment, the step of transmitting includes transmitting the command signal via a telecommand uplink to the calibration unit and to the multi-port amplifier.

In accordance with another aspect of the present invention there is provided a method of error correction parameter estimation for calibrating a multi-port amplifier transmitting traffic signals, the method comprising the steps of:

calculating an objective function defined for estimating the complex gain errors and error correction parameters of the traffic signals;

selecting a calibration mode defined to ensure a unique solution, avoid runaway adjustment, reduce error correction range, and improve convergence;

iteratively optimizing a leakage level of an amplified/leaked calibration signal coupled to the traffic signals using a search approach to minimize leakage of the multi-port amplifier.

In one embodiment, the step of calculating includes calculating said objective function defined as an aggregate leakage of said multi-port amplifier.

Conveniently, the step of calculating includes calculating said aggregate leakage from said calibration signal being one of a single-input and multiple-output measurement, a multiple-input and single-output measurement, and a multiple-input and multiple-output measurement.

In one embodiment, the step of selecting includes selecting said calibration mode defining necessary variables in relationship with the complex gain errors, and an error correction pattern for establishing a relationship between the error correction parameters and said necessary variables.

Conveniently, the step of selecting includes defining said necessary variables as gain/phase tracking errors with reference to an internal path of said multi-port amplifier, or as differences between gain/phase errors and an average gain/phase error of all internal paths of said multi-port amplifier with a constraint equation.

Alternatively, the step of selecting includes defining said error correction pattern to compensate gain/phase errors to an internal path of said multi-port amplifier, or to an average gain/phase error of all internal paths of said multi-port amplifier.

Other objects and advantages of the present invention will become apparent from a careful reading of the detailed description provided herein, with appropriate reference to the accompanying drawings.

BRIEF DESCRIPTION OF THE DRAWINGS

Further aspects and advantages of the present invention will become better understood with reference to the description in association with the following Figures, in which similar references used in different Figures denote similar components, wherein:

FIG. 6 is an illustrative embodiment of the equations of the calibration algorithms for estimating error-compensating parameters using a processing unit with a ground computer or optionally onboard processor;

FIG. 7 is a tabular description of the calibration modes that establish the relationship between the gain/phase error parameters and error compensating parameters;

DETAILED DESCRIPTION OF THE INVENTION

With reference to the annexed drawings the preferred embodiment of the present invention will be herein described for indicative purpose and by no means as of limitation.

The illustrative embodiments recognize and take into account that it may be desirable to have the capability to monitor and optimize the leakage performance of a multi-port amplifier 10, particularly without significant interferences to the traffic signals and without adding excessive complexity to the system to preserve its reliability.

Figure 1:
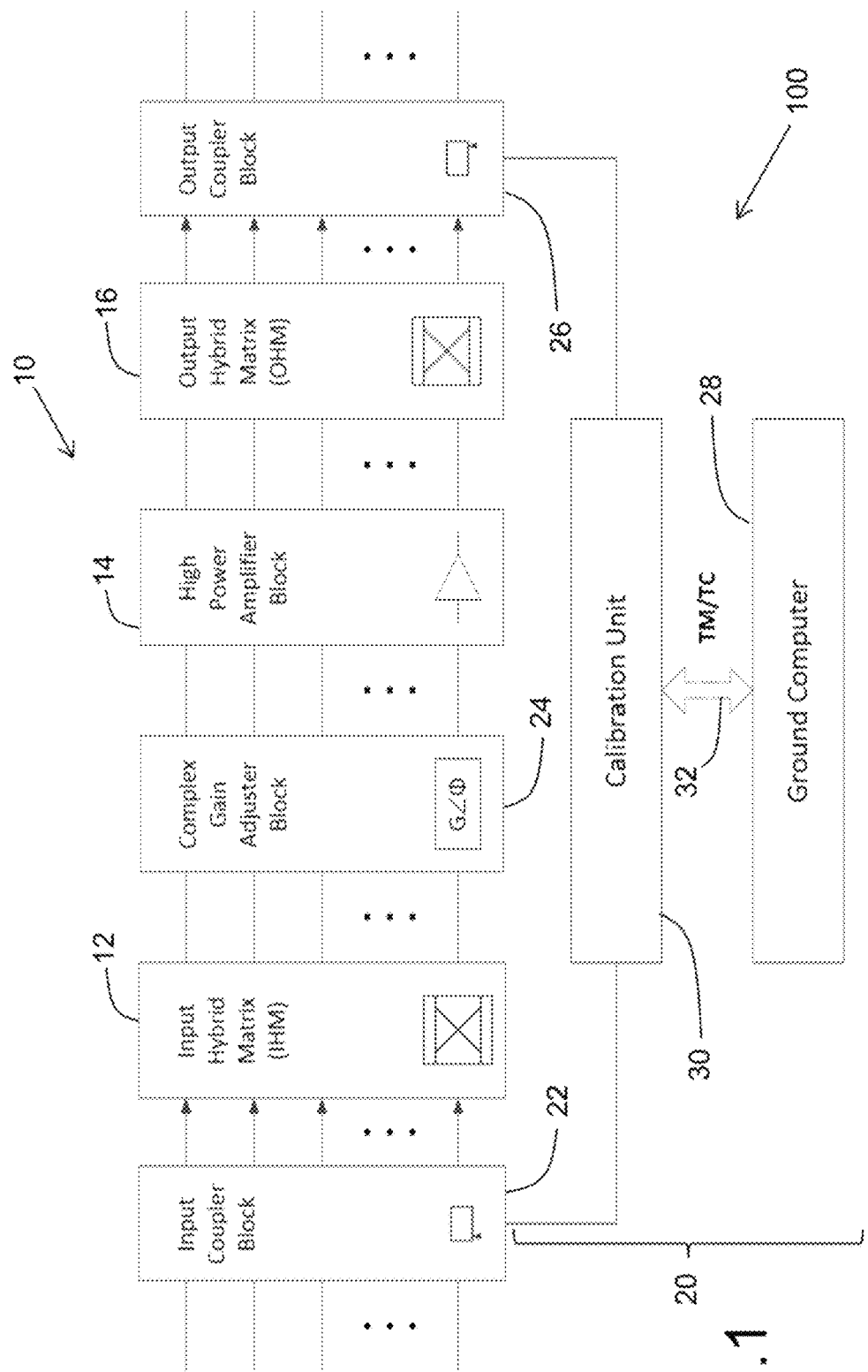
FIG. 1 is a schematic block diagram for a multi-port amplifier with calibration system and apparatus in accordance with an illustrative embodiment in accordance with the present invention.

FIG. 1 is a schematic block diagram for a system 100 including a multi-port amplifier 10 with a calibration apparatus 20 in accordance with an illustrative embodiment of the present invention. The multi-port amplifier 10 comprises an input hybrid matrix 12, a plurality of high power amplifiers 14, an output hybrid matrix 16, all connecting to a calibration system 100. The calibration system 100 comprises a plurality of input couplers 22 connected upstream to the input hybrid matrix 12, a plurality of complex gain adjusters 24 connected between the input hybrid matrix 12 and the plurality of high power amplifiers 14, a plurality of output couplers 26 connected downstream of the output hybrid matrix 16, and the calibration apparatus 20 including a calibration unit 30 connected to a processing unit 28 (computer, processor or the like), typically located in a ground station (not shown), via telemetry and telecommand channels 32 and the ground computer.

A plurality of signals is amplified using the multi-port amplifier 10 to form a plurality of amplified signals. Each input signal is distributed by the input hybrid matrix 12 and injected into a plurality of high power amplifier inputs, then amplified by the high power amplifiers 14 and injected into the plurality of the output hybrid matrix inputs, and again distributed by the output hybrid matrix 16 and coherently combined at a specific wanted output of the hybrid matrix. Any imperfections of the multi-port amplifier components, including any passive components and connecting cables and waveguides, will cause cross-talk and produce leakages at the unwanted output ports.

Figure 8:
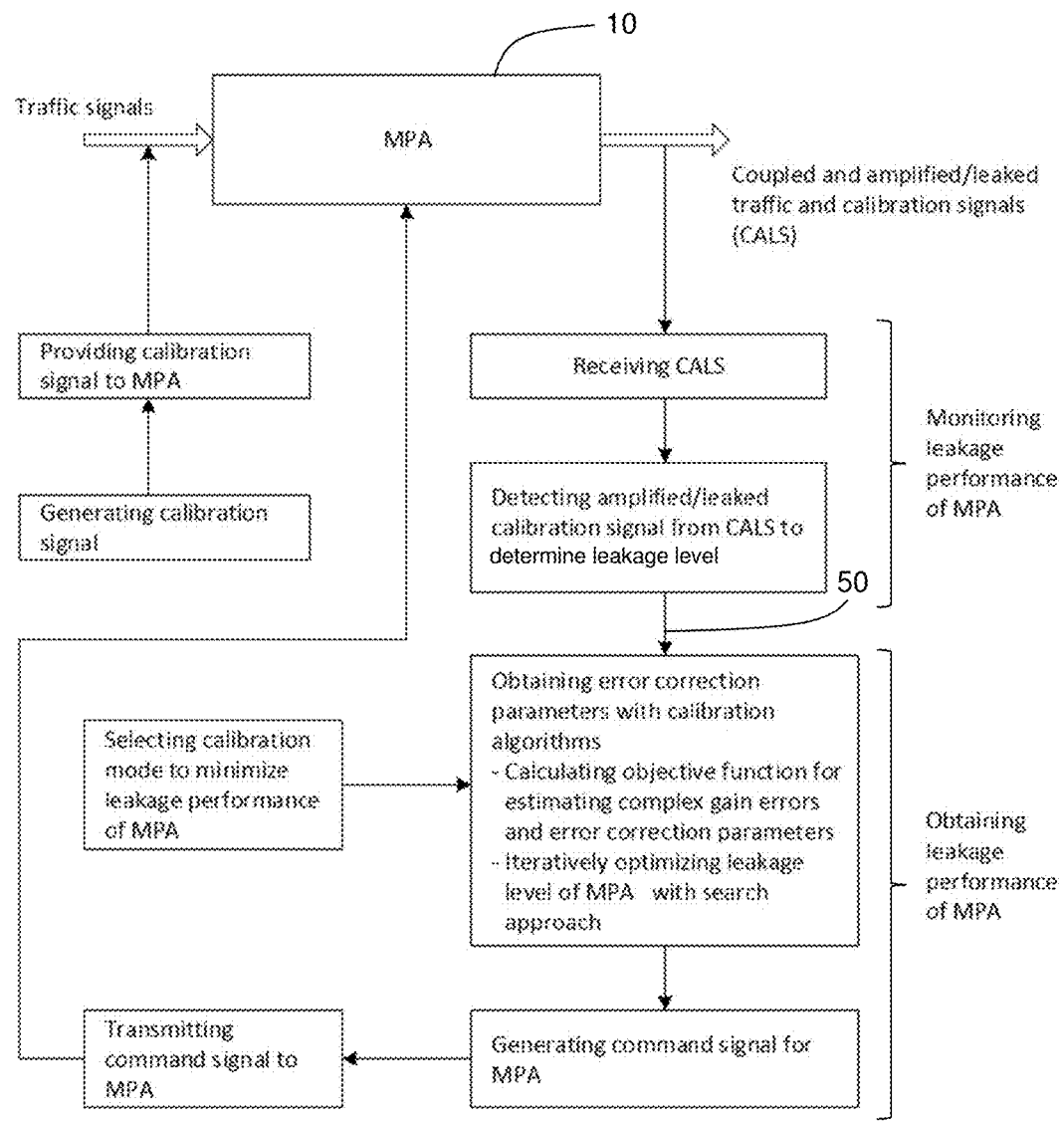
FIG. 8 is a schematic block diagram of a calibration method for optimizing the leakage performance of an MPA in accordance with the present invention.

In order to monitor and, when needed, optimize the leakage performance of the multi-port amplifier 10, as illustrated in FIG. 8, a calibration signal is generated by the calibration unit 30, injected into any input port of the hybrid matrix 12 via a selected input coupler 22, amplified by the multi-port amplifier 10; the amplified/leaked calibration signals at MPA wanted/unwanted output ports are coupled out by output couplers 26, and then detected by the calibration unit 20; the DC output 50 of the detected calibration signal in the calibration unit 30 is typically transmitted to the ground station via a conventional or payload-specific telemetry link 32, whichever is available, and calibration algorithms are run using a ground computer 28 to estimate the complex gain errors and needed complex gain adjustment; a command signal is then transmitted via a conventional or payload-specific telecommand link 32, whichever is available, to adjust the complex gain of the complex gain adjusters 24. After a few iterations, the leakage performance will be achieved or optimized.

Figure 2:
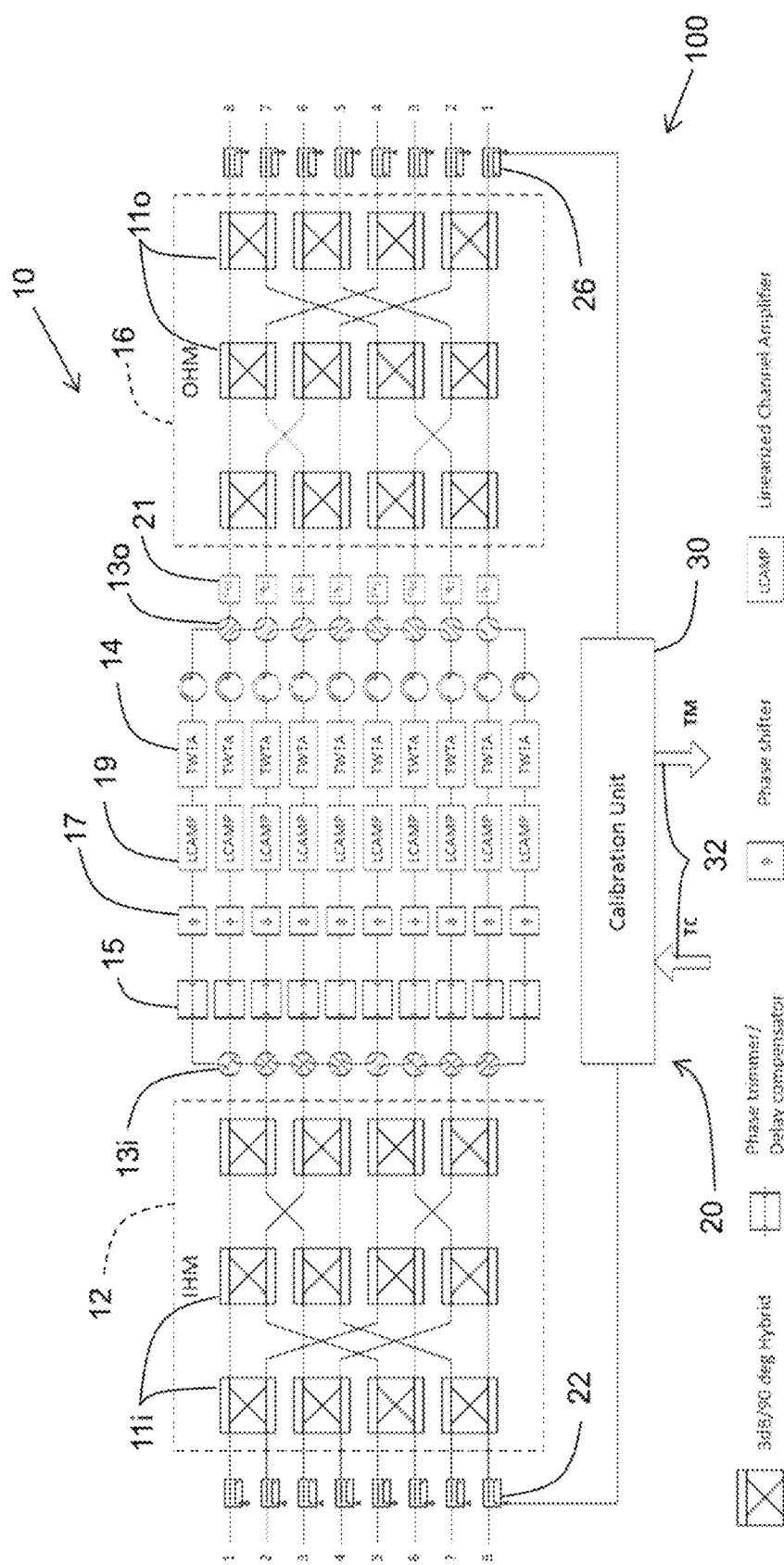
FIG. 2 is an explanatory block diagram for an 8×8 MPA with calibration system and apparatus in accordance with an illustrative embodiment in accordance with the present invention.

FIG. 2 is an explanatory block diagram for an 8×8 MPA with calibration apparatus 20 in accordance with an illustrative embodiment. Twelve input hybrids 11i comprise the input hybrid matrix 12, the input 13i and output 13o switches provide capability for redundancy configurations, phase trimmers 15 provide capability for initial alignment of group delay and phase tracking errors among the internal paths, phase shifters 17 and linearized channel amplifiers (LCAMPs) 19 provide capability for the phase and gain adjustment, traveling wave tube amplifiers (TWTAs) 14 provide high power capability, low pass filters 21 provide harmonic rejection, and twelve output hybrids 110 comprise the output hybrid matrix.

Figure 3:
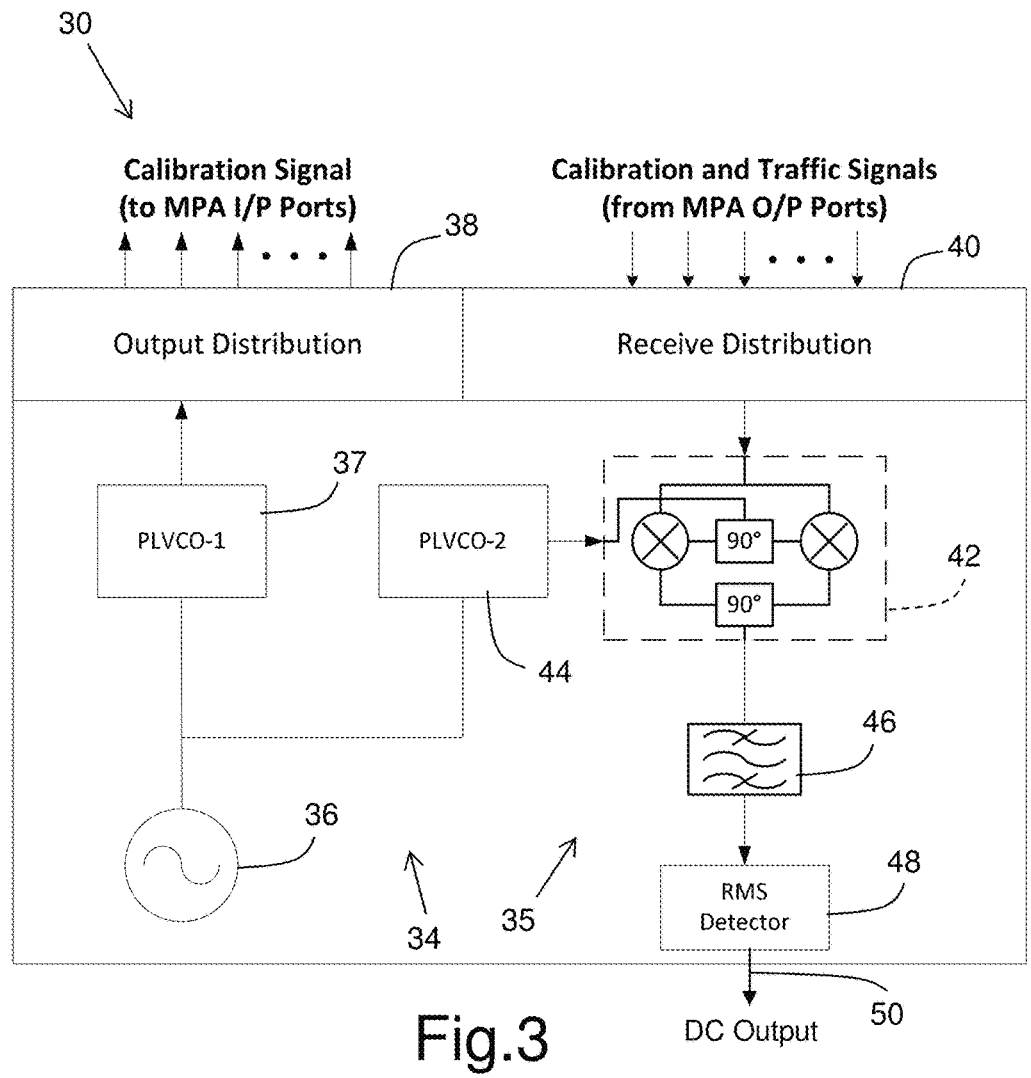
FIG. 3 is an illustration of a calibration unit in accordance with an illustrative embodiment in accordance with the present invention.

FIG. 3 is an illustration of a calibration unit 30 in accordance with an illustrative embodiment of the present invention. The calibration unit 30 comprises a commandable frequency calibration signal generator 34 which generates the calibration signal, and a fixed-intermediate frequency (IF) image-reject receiver (or calibration signal detector) which receives the coupled and amplified/leaked calibration and traffic signals (CALS) from the multi-port amplifier 10 and detects the amplified/leaked calibration signal therefrom.

The reference oscillator 36 (for example, temperature-compensated crystal oscillator) generates a frequency-stable reference signal, the phase-locked voltage-controlled oscillator 1 (PLVCO-1) 37 provides the calibration signal of commandable frequency, and the output distribution network 38 provides switchable distribution of the calibration signal that will be injected into the input ports of the multi-port amplifier 10.

The receive distribution network 40 provides switchable routing of the amplified/leaked calibration signals coupled from the MPA output ports, the image-reject mixer/receiver 42 provides a fixed-IF output and rejects the traffic signals at the image frequency, the phase-locked voltage-controlled oscillator 2 (PLVCO-2) 44 provides the commandable local oscillator (LO) frequency to the image-reject mixer 42, the IF filter 46 is a narrowband filter, such as a crystal filter or surface acoustic wave (SAW) filter, to filter out traffic signals and intermodulation noise, and the root mean square (RMS) detector 48 is an IF power detector of large dynamic range. The output of the RMS detector 48 is a DC signal 50 representing the level of the calibration tone or its leakage, which is transmitted to the processing unit 28, such as on a ground station (not shown) using the conventional or payload-specific telemetry link 32, whichever is available.

Figure 4:
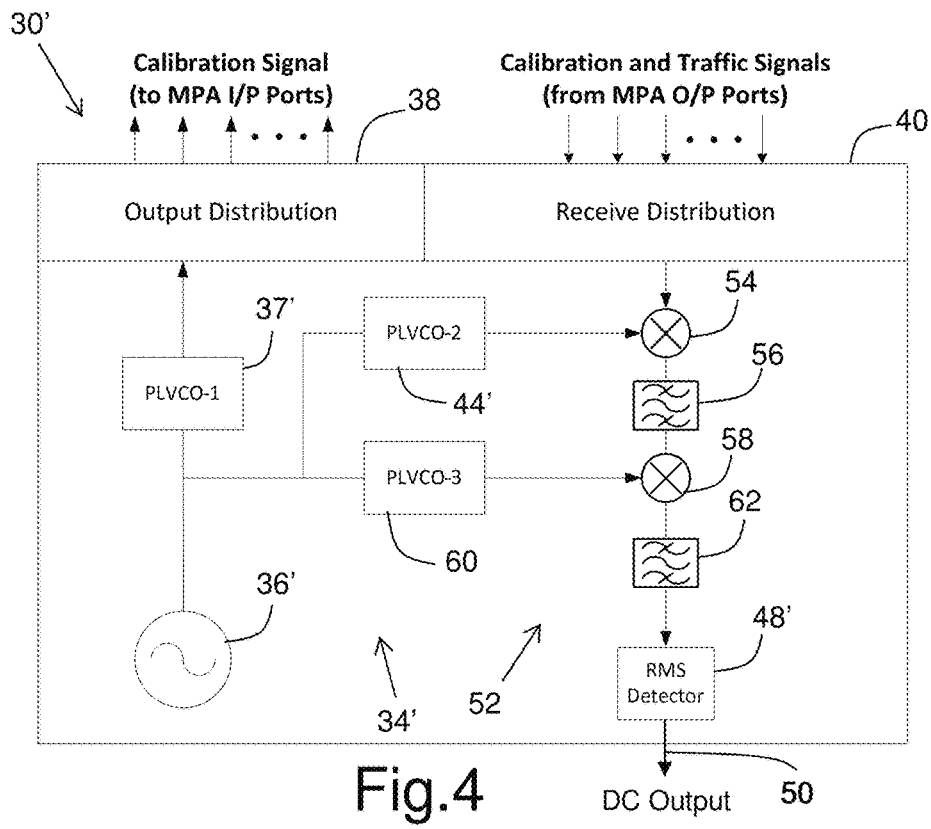
FIG. 4 is an illustration of another configuration for the calibration unit in accordance with an illustrative embodiment in accordance with the present invention.

FIG. 4 is an illustration of another configuration for the calibration unit 30' in accordance with an illustrative embodiment of the present invention. The calibration unit 30' comprises a commandable frequency signal generator 34' which generates the calibration signal, and a dual-conversion receiver 52 (or calibration signal detector) which receives and detects the amplified/leaked calibration signals with the traffic signals from the multi-port amplifier 10.

The reference oscillator 36' generates a frequency-stable reference signal, the phase-locked voltage-controlled oscillator 1 (PLVCO-1) 37' provides the calibration signal of commandable frequency, and the output distribution network 38 provides switchable distribution of the calibration signal that will be injected into the input ports of the multi-port amplifier 10.

The receive distribution network 40 provides switchable routing of the amplified/leaked calibration signals coupled from the MPA output ports, the dual-conversion mixer/receiver includes the first mixer 54 and the phase-locked voltage-controlled oscillator 2 (PLVCO-2) 44' provide the first IF output, the first IF bandpass filter 56 rejects the traffic signals at the image frequency, the second mixer 58 and the phase-locked voltage-controlled oscillator 3 (PLVCO-3) 60 provide a fixed-IF output, the second IF filter 62, downstream of the dual-conversion receiver, is a narrowband filter, such as a crystal filter or SAW filter, to filter out traffic signals and intermodulation noise, and the RMS detector 48' is an IF power detector of large dynamic range. The output of the RMS detector 48' is a DC signal 50 representing the level of the calibration tone and its leakages, which is transmitted to the processing unit 28, such as on a ground station (not shown) using a conventional or payload-specific telemetry link 32, whichever is available.

Figure 5:
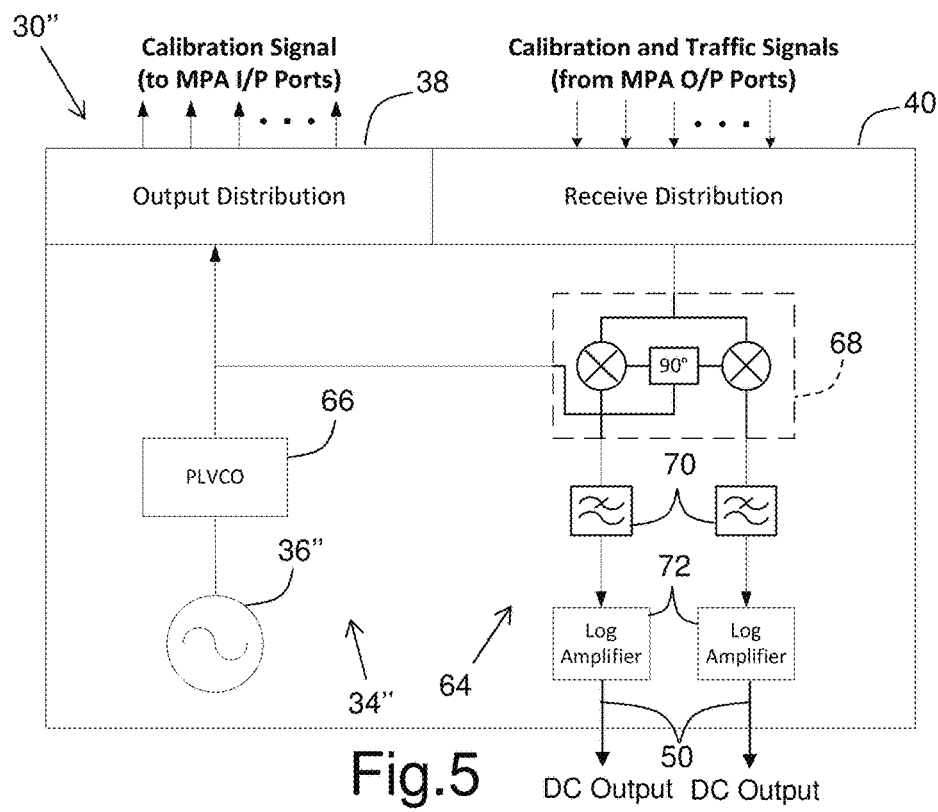
FIG. 5 is an illustration of yet another configuration for the calibration unit in accordance with an illustrative embodiment in accordance with the present invention.

FIG. 5 is an illustration of yet another configuration for the calibration unit 30" in accordance with an illustrative embodiment of the present invention. The calibration unit 30" comprises a commandable frequency signal generator 34" which generates the calibration signal, and a zero-IF receiver 64 (or calibration signal detector) which receives and detects the amplified/leaked calibration signals with the traffic signals from the multi-port amplifier 10.

The reference oscillator 36" generates a frequency-stable reference signal, the phase-locked voltage-controlled oscillator (PLVCO) 66 provides the calibration signal of commandable frequency, and the output distribution network 38 provides switchable distribution of the calibration signal that will be injected into the input ports of the multi-port amplifier 10.

The receive distribution network 40 provides switchable routing of the amplified/leaked calibration signals coupled from the MPA output ports, the in-phase and quadrature (IQ) mixer 68 (or zero-IF receiver) provides an in-phase and quadrature components of the received signal, the baseband low-pass filters 70 are narrowband filters to filter out infer-ences from traffic signals and intermodulation noise, and the two logarithmic (LOG) amplifiers 72 provide the logarithmic amplifications for the IQ components of amplified/leaked calibration signal of large dynamic range. The outputs of the LOG amplifiers 72 are 2 DC signals 50 which are transmitted to the processing unit 28, such as on a ground station (not shown) using a conventional or payload-specific telemetry link 32, whichever is available. The magnitude of the complex signal ($\sqrt{I^2+Q^2}$) 50 represents the level of the calibration tone or its leakage.

In another configuration for a calibration unit in accordance with an embodiment (not shown) of the present invention, the calibration signal generator includes a phase-locked voltage-controlled oscillator (PLVCO) and a spread spectrum modulator, and the calibration signal detector includes a spread spectrum demodulator.

Although not specifically illustrated in the Figures, the calibration signal generator 34, 34', 34" of the calibration unit 30, 30', 30" could also be located on a ground station and incorporate with the other sections of the calibration unit 30, 30', 30" via telecommand uplink or the like, similarly to the processing unit 28.

FIG. 6 is an illustrative embodiment of the equations of the calibration algorithms for estimating error-compensating parameters using a computer (not shown), such as typically a ground computer or optionally onboard processor, of the processing unit 28. The calibration algorithms use as data inputs the DC signals 50 proportional to the levels of the MPA-amplified/leaked signals from the calibration unit 30, 30', 30" typically via a telemetry receiver 32, calculate the aggregate leakage as the objective function, estimate the required error-compensating parameters to minimize the aggregate leakage, and adjust the complex gain of the complex gain adjusters 24 typically via the telecommand link 32, for several iterations until the leakage performance is achieved or optimized. The optimization algorithms are typically implemented in a ground computer so as to avoid complicated onboard apparatus unless onboard apparatus is readily available to provide the necessary computing power, and the error correction parameters, estimated from the optimization algorithms, are uplinked to the onboard apparatus via a conventional telecommand link 32 but not limited to such link.

For a multi-port amplifier 10 of N input ports and N output ports, the objective function—aggregate leakage is calculated by the equation below:

$$F = \sum_i \sum_{j \ne i} P_{ji}/P_{ii}$$

where
i: input port number, $\Sigma_i$ can take any combination of the input ports, for example, i=1 or i=1, 4 or i=1, 2, . . . , N;
$P_{ii}$: Calibration signal level at output port i when calibration signal injected at input port i; and
$P_{ji|j \ne i}$: Leakage level at output port j with calibration signal injected at input port i.

The objective function comprises unknown error parameters—complex gain errors ($g_{ek}e^{j\Phi_{ek}}$) and error correction parameters ($g_{ck}e^{j\Phi_{ck}}$). The goal is to seek the error correction parameters to compensate the complex gain errors. However, the estimates of the complex gain errors and associated correction parameters from the optimization goal may not be unique due to gain/phase tracking phenomena. As such, calibration modes are defined to provide a unique solution, avoid runaway adjustment, reduce error correction range, and improve convergence.

FIG. 7 is a tabular description of the calibration modes. For each calibration mode, a set of necessary variables to be solved are defined from the error parameters, an error correction pattern is defined, and a relationship is established between the error correction parameters and the necessary variables. For N internal paths, there are N−1 necessary tracking parameters requiring correction. The calibration mode may define a set of N complex independent variables ($x_k e^{jy_k}$, k=1, 2, . . . , N) with a constraint equation, based on the virtual complex gain errors ($g_{ek} e^{j\phi_{ek}}$, k=1, 2, . . . , N).

Calibration mode 1: The necessary variables are defined as the gain/phase tracking errors. As an example, take path N as the reference path, and let $x_k = g_{ek} - g_{eN}, y_k = \phi_{ek} - \phi_{eN}, k=1,2,\ldots,N.$ A constraint equation $x_N e^{jy_N}=0$ holds true by definition.

The complex gain errors across the internal paths are compensated to the error of the reference path, namely, $g_{ck} \overset{\text{def}}{=} g_{eN} - g_{ek} = -x_k, k=1,2,\ldots,N;$ $\phi_{ck} \overset{\text{def}}{=} \phi_{eN} - \phi_{ek} = -y_k, k=1,2,\ldots,N.$ It follows that the range of a necessary variable is 2 times of the gain/phase error range, and the range of the gain/phase adjustment is 2 times of the gain/phase error range.

Calibration mode 2: The necessary variables are defined as the gain/phase tracking errors. As an example, take path N as the reference path, and let $x_k = g_{ek} - g_{eN}, y_k = \phi_{ek} - \phi_{eN}, k=1,2,\ldots,N.$ A constraint equation $x_N e^{jy_N}=0$ holds true by definition.

The gain/phase errors across the internal paths are compensated to the average gain/phase error, namely, $g_{ck} \overset{\text{def}}{=} -g_{ek} + \widehat{g_e} = -x_k + \hat{x}, k=1,2,\ldots,N;$ $\phi_{ck} \overset{\text{def}}{=} -\phi_{ek} + \widehat{\phi_e} = -y_k + \hat{y}, k=1,2,\ldots,N.$ It follows that the range of a necessary variable is 2 times of the gain/phase error range, and the range of the gain/phase adjustment is $(1+1/\sqrt{N})$ times of the gain/phase error range.

Calibration mode 3: The necessary variables are defined as the differences between the gain/phase errors and the average gain/phase error, namely, $x_k = g_{ek} - \widehat{g_e}, y_k = \phi_{ek} - \widehat{\phi_e}, k=1,2,\ldots,N.$ Constraint equations $\Sigma_{k=1}^N x_k = 0$ and $\Sigma_{k=1}^N y_k = 0$ hold true by definition.

The gain/phase errors across the internal paths are compensated to the average gain/phase error, namely, $g_{ck} \overset{\text{def}}{=} -g_{ek} + \widehat{g_e} = -x_k, k=1,2,\ldots,N;$ $\phi_{ck} \overset{\text{def}}{=} -\phi_{ek} + \widehat{\phi_e} = -y_k, k=1,2,\ldots,N.$ It follows that the range of a necessary variable is $\left(1 + \frac{1}{\sqrt{N}}\right)$ times of the gain/phase error range, and the range of the gain/phase adjustment is $\left(1 + \frac{1}{\sqrt{N}}\right)$ times of the gain/phase error range.

With the definition of the necessary variable to solve and the establishment of the relationship between the necessary variables and the error correction parameters, the objective function can be optimized with iterative approaches such as pattern search and line search.

FIG. 8 is a schematic block diagram of a calibration method for optimizing the leakage performance of an MPA 10 in accordance with the present invention, as described in details hereinabove and hereinbelow.

Figure 9:
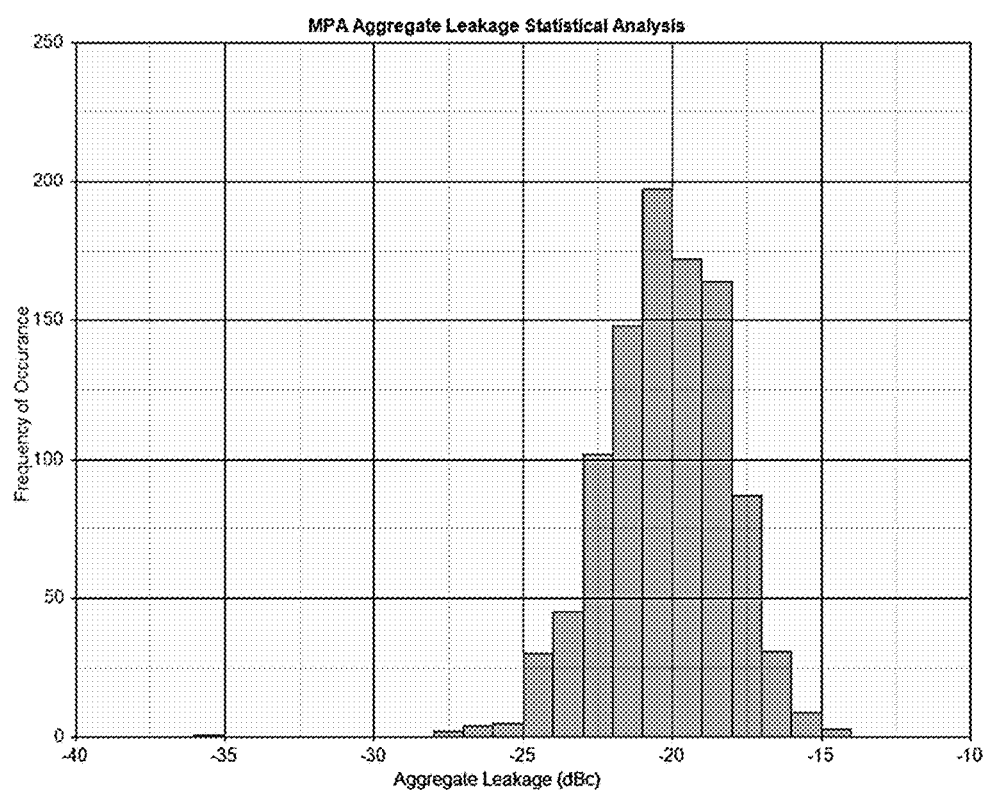
FIG. 9 is a graph showing a simulation of the distribution function of the aggregate leakage of an MPA without a calibration system.

FIG. 9 is a graph showing a simulation of the distribution function of the aggregate leakage of an MPA 10 without a calibration system 100. The simulation takes into account the TWTA aging and radiation effects with the assumption that other radio frequency (RF) components are ideal in electrical performance. It is shown with this optimistic prediction that the MPA aggregate leakage is typically worse than about −20 dB over the operation life. It is expected that an in-orbit calibration is needed for the MPAs of high isolation performance.

Figure 10:
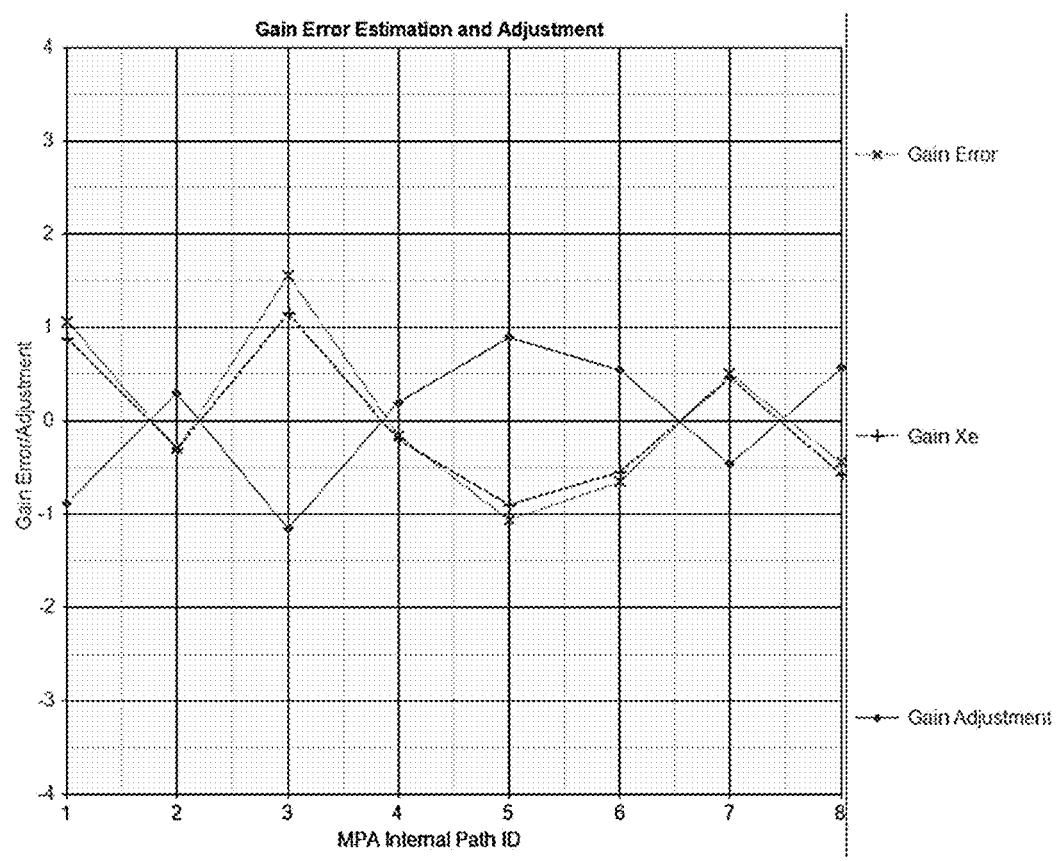
FIGS. 10 and 11 are respective illustrations of the gain and phase errors in a worst case, and the estimated error-compensating parameters.
Figure 11:
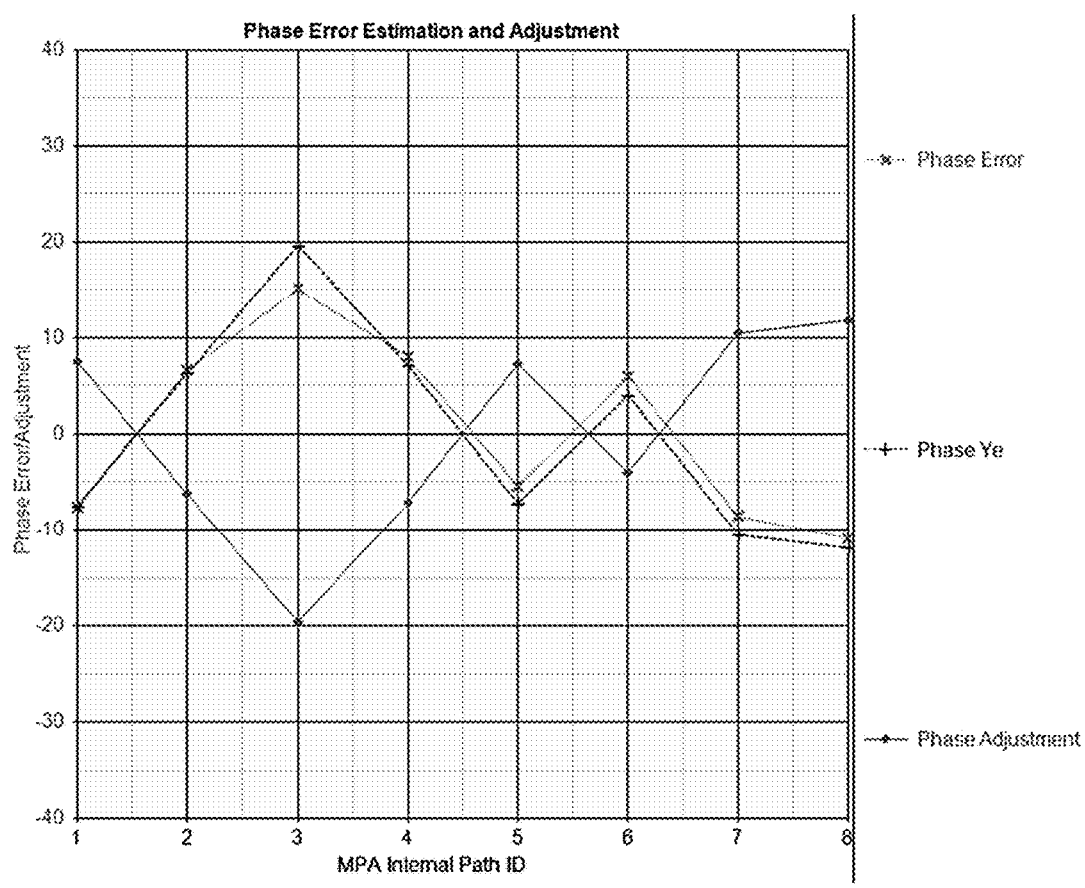

FIGS. 10 and 11 are an illustration of the gain errors in a worst case, the necessary variables solved from optimization, and the error correction parameters for error compensation. The X symbols show the gain/phase errors of the MPA internal paths. The worst case errors are obtained from a statistical analysis yielding a high aggregate leakage. The cross symbols (+) show the necessary variables estimated from the optimization. The values of the necessary variables track well with the gain/phase errors. The diamond symbols (◊) show the required values of the error corrections parameters calculated from the solved necessary variables. Calibration mode 3 is used in this simulation.

Figure 12:
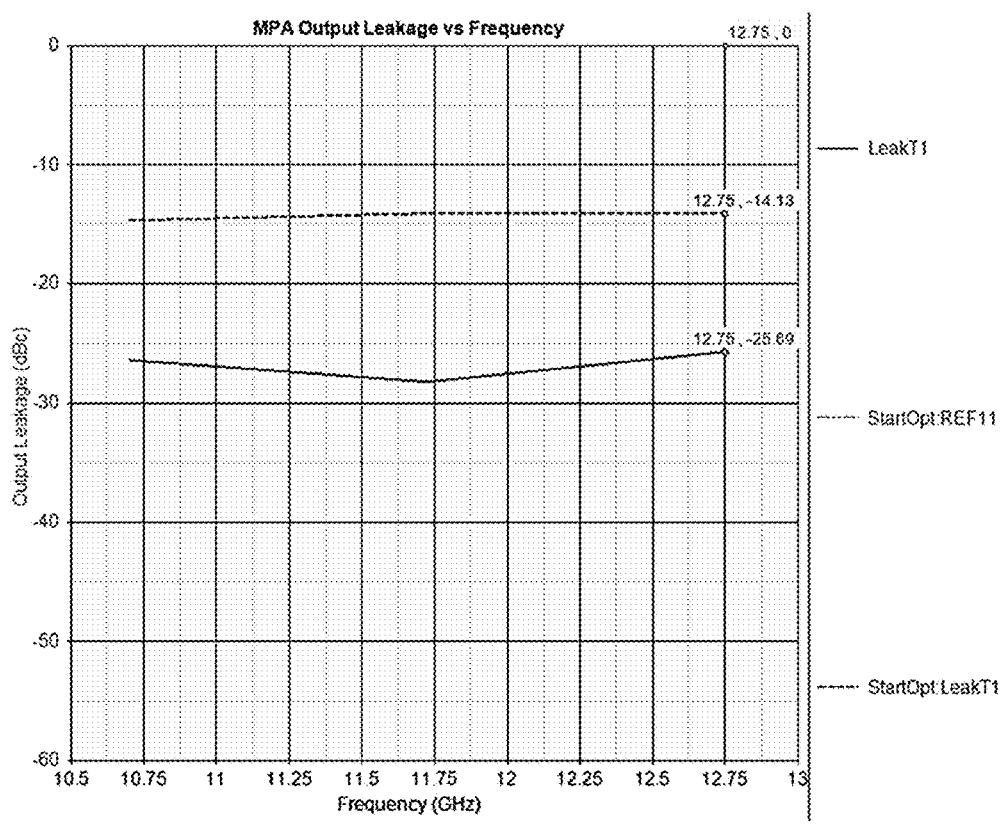
FIG. 12 is an illustration of the MPA aggregate leakage before calibration for the worst case shown in FIGS. 10 and 11, and after calibration with the estimated error-compensating parameters.

FIG. 12 is an illustration of the MPA aggregate leakage before and after calibration for the worst case shown in FIGS. 10 and 11. The simulated frequency range is from 10.7 to 12.75 GHz representing the full Ku-band downlink frequency range. Three frequency points (low band edge, center frequency and high band edge) are used in simulation. Calibration mode 3 is used to define the necessary variables and establish the relationship between the error correction parameters and the necessary variables. A noise power ratio (NPR) of 15 dB is assumed. A pattern search approach is used in optimization. The dashed line shows the aggregate leakage before calibration, which is worse than −15 dB. The solid line shows the aggregate leakage after calibration, which meets the optimization goal of about −25 dB.

Although the present invention has been described with a certain degree of particularity, it is to be understood that the disclosure has been made by way of example only and that the present invention is not limited to the features of the embodiments described and illustrated herein, but includes all variations and modifications within the scope of the invention as hereinabove described and hereinafter claimed.

The invention claimed is:

1. A system for calibrating a multi-port amplifier transmitting traffic signals using a plurality of high power amplifiers located onboard a spacecraft and providing a plurality of input ports and a plurality of output ports of the multi-port amplifier, the system comprising a calibration apparatus including a calibration unit connecting to the plurality of input and output ports, and a processing unit connecting to the calibration unit for implementing and running calibration algorithms, said calibration unit including:
- a calibration signal generator generating a calibration signal being one of a sinusoidal signal, modulated signal and a spread spectrum signal with flexible calibration center frequency;
- a calibration signal output distribution network providing said calibration signal to at least one of the plurality of input ports;
- a calibration signal receive distribution network receiving said calibration signal amplified and leaked by the multi-port amplifier and coupled to the traffic signals from at least one of the plurality of output ports;
- a calibration signal detector detecting the amplified/leaked calibration signal from the calibration signal receive distribution network while the traffic signals are present, and determining a leakage level of the calibration signal.

2. The system of claim 1, wherein said calibration signal generator comprises a phase-locked voltage-controlled oscillator, and said calibration signal detector comprises a fixed-IF image-reject receiver, a narrowband IF filter and an RMS detector.

3. The system of claim 1, wherein said calibration signal generator comprises a phase-locked voltage-controlled oscillator, and said calibration signal detector comprises a dual-conversion receiver, a narrowband IF filter and an RMS detector.

4. The system of claim 1, wherein said calibration signal generator comprises a phase-locked voltage-controlled oscillator, and said calibration signal detector comprises a zero-IF receiver, narrowband low-pass filters and logarithmic amplifiers.

5. The system of claim 1, further including a telemetry downlink and a telecommand uplink to connect the calibration unit with the processing unit located on a ground station.

6. A method for calibrating a multi-port amplifier of the system of claim 1, the method comprising the steps of:
- generating a calibration signal being one of a sinusoidal signal, modulated signal and a spread spectrum signal, centered at a calibration frequency at a time;
- providing said calibration signal to at least one of the plurality of input ports;
- receiving said calibration signal amplified/leaked by the multi-port amplifier and coupled with the traffic signals from at least one of the plurality of output ports; and
- detecting the amplified/leaked calibration signal to determine a leakage level of the calibration signal.

7. The method of claim 6, wherein the step of generating includes determining said calibration frequency to be located at at least one single point depending on a frequency bandwidth of the traffic signals and a leakage performance requirement of the multi-port amplifier.

8. The method of claim 6, wherein the step of generating includes determining said calibration frequency to be flexible, commandable and adaptable to changes of a traffic frequency plan of the traffic signals so as to ensure that the calibration signal and the traffic signals are compatible.

9. The method of claim 6, wherein the traffic signals have a traffic frequency band thereof, and the step of generating includes determining said calibration frequency to be selectively located at one of a band edge of the traffic frequency band, a guard band of the traffic frequency band, a sub-channel free of the traffic signals, and an out-of-traffic signal band.

10. The method of claim 6, wherein said calibration signal has a calibration signal amplitude level being lower by at least 20 dB than a traffic amplitude level of the traffic signals and the step of detecting includes detecting said calibration signal using a narrowband filter so as to allow the calibration frequency to be located within a traffic frequency band of the traffic signals.

11. The method of claim 6, wherein said calibration signal is spread spectrally as a pseudo random noise spectrum and the step of detecting includes detecting said calibration signal using a spread spectrum demodulator so as to allow the calibration frequency to be located within a traffic frequency band of the traffic signals.

12. The method of claim 6, wherein the calibration signal and the coupled and amplified/leaked calibration signal are one of a single-input and multiple-output measurement, a multiple-input and single-output measurement, and a multiple-input and multiple-output measurement, so as to permit statistical averaging.

13. The method of claim 6, further including the steps of:
- determining a calibration mode to minimize a leakage performance of said multi-port amplifier;
- obtaining error correction parameters for the multi-port amplifier via calibration algorithms estimating complex gain errors thereof from the detected leakage level of the calibration signal;
- generating a command signal for the multi-port amplifier based on the estimated error correction parameters; and
- transmitting the command signal to the multi-port amplifier.

14. The method of claim 13, wherein the step of detecting includes transmitting the leakage level of the calibration signal from the calibration unit to a ground station via a telemetry downlink.

15. The method of claim 14, wherein the steps of selecting, obtaining and generating are implemented in a ground computer of the processing unit located on the ground station so as to avoid complicated onboard apparatus.

16. The method of claim 15, wherein the step of transmitting includes transmitting the command signal via a telecommand uplink to the calibration unit and to the multi-port amplifier.

* * * * *